United States Patent
Kakiuchi et al.

(10) Patent No.: US 9,647,224 B2
(45) Date of Patent: May 9, 2017

(54) METHOD AND APPARATUS FOR MANUFACTURING ORGANIC EL DEVICE

(75) Inventors: Ryohei Kakiuchi, Ibaraki (JP);
Shigenori Morita, Ibaraki (JP);
Kanako Hida, Ibaraki (JP)

(73) Assignee: NITTO DENKO CORPORATION, Osaka (JP)

(*) Notice: Subject to any disclaimer, the term of this patent is extended or adjusted under 35 U.S.C. 154(b) by 0 days.

(21) Appl. No.: 14/114,142

(22) PCT Filed: Apr. 6, 2012

(86) PCT No.: PCT/JP2012/059439
§ 371 (c)(1),
(2), (4) Date: Oct. 25, 2013

(87) PCT Pub. No.: WO2012/147493
PCT Pub. Date: Nov. 1, 2012

(65) Prior Publication Data
US 2014/0051198 A1    Feb. 20, 2014

(30) Foreign Application Priority Data
Apr. 26, 2011  (JP) .................. 2011-098172

(51) Int. Cl.
*H01L 21/00*    (2006.01)
*H01L 51/50*    (2006.01)
(Continued)

(52) U.S. Cl.
CPC .......... *H01L 51/5012* (2013.01); *C23C 14/12* (2013.01); *C23C 14/24* (2013.01);
(Continued)

(58) Field of Classification Search
CPC ................................ H01L 51/5012
(Continued)

(56) References Cited

U.S. PATENT DOCUMENTS

2003/0034497 A1*  2/2003  Yamazaki et al. ........... 257/86
2004/0062856 A1*  4/2004  Marcus ............... H01L 51/0002
427/66

(Continued)

FOREIGN PATENT DOCUMENTS

CN    101962750 A    2/2001
CN    101182627 A    5/2008
(Continued)

OTHER PUBLICATIONS

Notification of Transmittal of Translation of the International Preliminary Report on Patentability (Form PCT/IB/326) of International Application No. PCT/JP2012/059439 mailed Nov. 7, 2013 with Forms PCT/IB/373, PCT/IB/338 and PCT/ISA/237.
(Continued)

*Primary Examiner* — Igwe U Anya
(74) *Attorney, Agent, or Firm* — Adele Critchley

(57) ABSTRACT

Provided is a method for manufacturing an organic EL device, including: a vapor deposition step of forming an organic layer over a substrate moving relative to a nozzle by discharging a vaporized organic layer-forming material through the nozzle. The vapor deposition step is performed so that a light emitting region formed of the organic layer and having a width A (mm) in a direction perpendicular to a direction in which the substrate is moving is formed, and so that W≥A+2×h (where h≤5 mm) is satisfied, where a length of an opening of the nozzle in the direction perpendicular to the direction in which the substrate is moving is denoted by W (mm), and a distance between the opening and the substrate is denoted by h (mm).

18 Claims, 6 Drawing Sheets

(51) Int. Cl.
*C23C 14/24* (2006.01)
*H05B 33/10* (2006.01)
*H01L 51/00* (2006.01)
*C23C 14/12* (2006.01)
*C23C 14/56* (2006.01)
*H01L 51/56* (2006.01)

(52) U.S. Cl.
CPC ........ *C23C 14/562* (2013.01); *H01L 51/0002* (2013.01); *H01L 51/0004* (2013.01); *H01L 51/56* (2013.01); *H05B 33/10* (2013.01); *H01L 2251/55* (2013.01)

(58) Field of Classification Search
USPC .......................................................... 438/46
See application file for complete search history.

(56) References Cited

U.S. PATENT DOCUMENTS

| | | | | |
|---|---|---|---|---|
| 2005/0100660 | A1* | 5/2005 | Ito | H01L 51/0005 427/66 |
| 2006/0132461 | A1* | 6/2006 | Furukawa | H01L 27/3274 345/173 |
| 2006/0216853 | A1* | 9/2006 | Nomoto | 438/99 |
| 2007/0176534 | A1* | 8/2007 | Abiko et al. | 313/498 |
| 2008/0115729 | A1 | 5/2008 | Oda et al. | |
| 2009/0047114 | A1* | 2/2009 | Yokoyama et al. | 414/806 |
| 2009/0104377 | A1 | 4/2009 | Yoshida et al. | |
| 2009/0304906 | A1* | 12/2009 | Suduo et al. | 427/8 |
| 2010/0055577 | A1* | 3/2010 | Chen et al. | 430/5 |
| 2011/0059256 | A1* | 3/2011 | Ebisawa | H01L 21/6715 427/424 |

FOREIGN PATENT DOCUMENTS

| | | |
|---|---|---|
| DE | 112007002294 T5 | 10/2009 |
| JP | 2008/038821 A1 | 4/2008 |
| JP | 2008-88490 A | 4/2008 |
| JP | 2008-287996 A | 11/2008 |
| JP | 2009-302045 A | 12/2009 |
| JP | 2011-068981 A | 4/2011 |
| KR | 10-2009-0045393 A | 5/2009 |
| TW | 2008-37207 A | 9/2008 |
| TW | 200847845 A | 12/2008 |
| WO | 2008/139788 A1 | 11/2008 |

OTHER PUBLICATIONS

International Search Report dated May 29, 2012, issued in corresponding application No. PCT/JP2012/059439.
Chinese Office Action dated May 18, 2015, issued in patent application No. 201280020020.4 (7 pages).
Office Action dated Dec. 8, 2015, issued in counterpart Taiwanese Patent Application No. 101113455. (5 pages).

* cited by examiner

METHOD AND APPARATUS FOR MANUFACTURING ORGANIC EL DEVICE

FIELD

The present invention relates to a method and an apparatus for manufacturing an organic EL device that has an organic layer over an electrode layer formed on a substrate and emits light from the organic layer.

BACKGROUND

Recently, attention has been given to organic EL (electroluminescence) devices, as devices for use as next-generation light emitting displays with low consumption power. An organic EL device basically has a pair of electrodes and at least one organic layer that includes a light emitting layer made of an organic light emitting material. Such an organic EL device is self-luminous and can emit multicolor light derived from the organic light emitting material. Therefore, attention has been focused thereon for use as displays for television (TV), etc.

The organic EL device is configured by sandwiching at least one organic layer including a light emitting layer between two electrode layers having opposite electrodes to each other (sandwich structure), in which each organic layer is composed of an organic film of several nm to several tens of nm. The organic layer sandwiched by the electrode layers is supported on a substrate, and the organic EL device is formed by sequentially stacking an anode layer, the organic layer, and a cathode layer on the substrate in this order. In the case where a plurality of organic layers are present, the respective organic layers are sequentially stacked over the anode layer.

In methods for manufacturing such an organic EL device, vacuum evaporation and coating are commonly known as a technique for forming a film of each organic layer over the anode layer formed on the substrate. Among these, vacuum evaporation is mainly used, because of the capability of increasing the purity of the material for forming the organic layer (organic layer-forming material) and the ease of achieving long life span.

In the above-mentioned vacuum evaporation, the organic layer is formed by performing vapor deposition using an evaporation source provided at a position facing the substrate in a vacuum chamber of a deposition apparatus. Therefore, the evaporation source is provided corresponding to the organic layer. Specifically, the organic layer-forming material is heated by a heating unit provided in the evaporation source so as to be vaporized, and the vaporized organic layer-forming material (vaporized material) is discharged through a nozzle provided in the above-mentioned evaporation source so as to be deposited over the anode layer formed on the substrate. Thus, the organic layer-forming material is vapor-deposited over the anode layer.

In such vacuum evaporation, a so-called batch process or roll process is employed. The batch process is a process in which the organic layer is vapor-deposited over the anode layer per one substrate on which the anode layer has been formed. Meanwhile, the roll process is a process in which: a strip-shaped substrate which has been wound up in roll form with the anode layer formed thereon is unwound continuously (in a so-called roll-to-roll manner); the respective organic layers are continuously vapor-deposited over the anode layer while the unwound substrate is supported on the surface of a can roll that is being rotationally driven and is moved together with the rotation of the can roll; and the substrate over which the organic layers have been vapor-deposited is wound up into a roll. Among these, it is desirable to employ the roll process for manufacturing organic EL devices, from the viewpoint of reducing the cost.

However, in the case where the roll process is employed in vacuum evaporation, the emission color varies from a desired emission color (unevenness occurs), as a result of which organic EL devices of low quality may be manufactured in some cases.

On the other hand, there is proposed a technique of decreasing the distance between the evaporation source and the substrate in vacuum evaporation, in order to reduce the amount of water to be introduced into the light emitting layer from the viewpoint of extending the life span (see Patent Literature 1). However, when the distance between the evaporation source and the substrate is decreased as mentioned above, the deposition amount of the organic layer-forming material decreases from the center to both ends of the substrate in the width direction of the substrate, as a result of which the film thickness is rendered larger at the center than at both ends. Therefore, organic EL devices of low quality with the emission color varying from the desired emission color are more likely to be manufactured, particularly, in the width direction of the substrate.

Therefore, in order to reduce the difference in deposition amount of the organic layer-forming material between the center and both ends in the width direction of the substrate in the roll process, it is proposed that the substrate is divided into at least two regions in its width direction by flow regulating members parallel to the direction in which the substrate is moving, and the organic layer-forming material is discharged through a slit defined by the flow regulating members, so as to be deposited over the substrate (see Patent Literature 2).

CITATION LIST

Patent Literature

Patent Literature 1: JP 2008-287996 A
Patent Literature 2: JP 2009-302045 A

SUMMARY

Technical Problem

However, when the flow regulating members are provided as mentioned above, the production efficiency of organic EL devices may possibly decrease due to a reduction in formation speed of organic layers, because the area of the opening of the nozzle is substantially reduced by the portion shielded by the flow regulating members.

In view of the above-mentioned problems, it is an object of the present invention to provide a method and an apparatus for manufacturing an organic EL device that enable efficient production of organic EL devices of high quality in which the variation in emission color is suppressed, while reducing the distance between the substrate and the evaporation source.

Solution to Problem

As a result of diligent studies in order to solve the above problems, the inventors have found that it is possible to efficiently manufacture organic EL devices of high quality in which the variation in emission color is suppressed, while reducing the distance between the substrate and the evaporation source, by setting the width (width of the opening of the nozzle in a direction perpendicular to a direction in which the substrate is moving) W of the opening of the nozzle, the emission width (width of the light emitting region in the direction perpendicular to the direction in which the substrate is moving) A of the organic layer formed over the substrate, and the distance h between the opening and the substrate so as to satisfy a specific relationship. Thus, the present invention has been accomplished.

That is, according to the present invention, there is provided a method for manufacturing an organic EL device, including: a vapor deposition step of forming an organic layer over a substrate moving relative to a nozzle by discharging a vaporized organic layer-forming material through the nozzle. The vapor deposition step is performed so that a light emitting region formed of the organic layer and having a width A (mm) in a direction perpendicular to a direction in which the substrate is moving is formed, and so that $W \geq A + 2 \times h$ (where $h \leq 5$ mm) is satisfied, where a length of an opening of the nozzle in the direction perpendicular to the direction in which the substrate is moving is denoted by W (mm), and a distance between the opening and the substrate is denoted by h (mm).

When the vapor deposition step is performed as mentioned above, it is possible to efficiently manufacture organic EL devices of high quality in which the variation in emission color is suppressed, while reducing the distance between the substrate and the evaporation source.

According to the present invention, there is also provided an apparatus for manufacturing an organic EL device, including: an evaporation source that forms an organic layer over a substrate moving relative to a nozzle by discharging a vaporized organic layer-forming material through the nozzle. The apparatus for manufacturing an organic EL device is configured so that a light emitting region formed of the organic layer and having a width A (mm) in a direction perpendicular to a direction in which the substrate is moving is formed, and so that $W \geq A + 2 \times h$ (where $h \leq 5$ mm) is satisfied, where a length of an opening of the nozzle in the direction perpendicular to the direction in which the substrate is moving is denoted by W (mm), and a distance between the opening and the substrate is denoted by h (mm).

Advantageous Effects of Invention

As described above, the present invention enables efficient production of organic EL devices of high quality in which the variation in emission color is suppressed, while reducing the distance between the substrate and the evaporation source.

DESCRIPTION OF EMBODIMENTS

Hereinafter, embodiments of a method for manufacturing an organic EL device and an apparatus for manufacturing an organic EL device according to the present invention are described with reference to the drawings.

Figure 1:
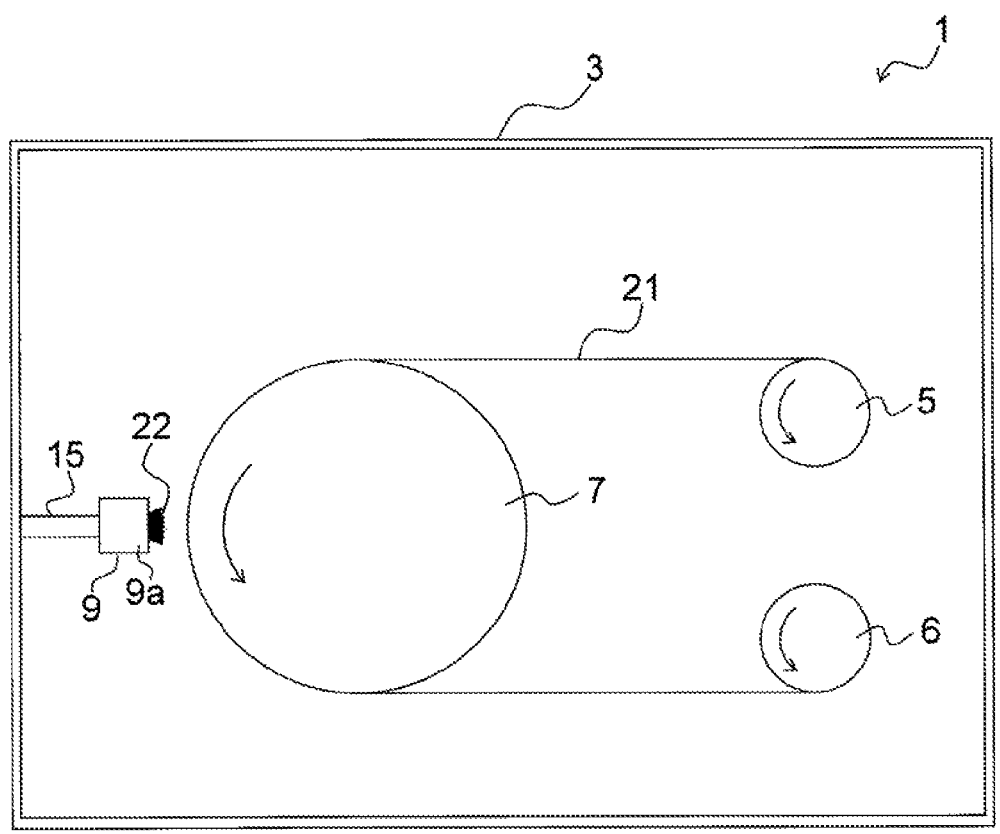
FIG. 1 is a schematic side sectional view schematically showing an apparatus for manufacturing an organic EL device according to one embodiment of the present invention to be used in a method for manufacturing an organic EL device according to one embodiment of the present invention.

An apparatus 1 for manufacturing an organic EL device is a deposition apparatus having a vacuum chamber 3, as shown in FIG. 1. In the vacuum chamber 3, a substrate feeding unit 5 as means for feeding a substrate, a can roll 7, an evaporation source 9, and a substrate restoring unit 6 are generally provided. The inside of the vacuum chamber 3 is brought into a reduced pressure state by a vacuum generating unit (not shown), so that a vacuum region can be formed thereinside.

As the above-mentioned substrate feeding unit 5, a feed roller 5 that unwinds a strip-shaped substrate 21 wound up in roll form is provided. As the above-mentioned substrate restoring unit 6, a take-up roller 6 that winds up the unwound substrate 21 is provided. That is, a so-called roll-to-roll process in which the substrate 21 unwound from the feed roller 5 is fed to the can roll 7 and then wound up by the take-up roller 6 is employed herein.

The can roll 7 is formed of cylindrical stainless steel and configured to be rotationally driven. The can roll 7 is arranged at a position such that the substrate 21 unwound (fed) from the feed roller 5 to be wound up into the take-up roller 6 can be hung around the can roll 7 with a specific tension. The circumferential surface (front surface) of the can roll 7 is configured to support the substrate 21 on the non-electrode layer side (specifically, the side opposite to the side on which the anode layer is provided). Further, the rotation (counterclockwise rotation shown in FIG. 1) of the can roll 7 causes the substrate 21 hung around (supported by) the can roll 7 to move in the direction of the rotation together with the can roll 7.

The can roll 7 preferably incorporates a temperature adjusting mechanism such as a cooling mechanism. This can stabilize the temperature of the substrate 21 during the later-mentioned film formation of an organic layer over the substrate 21. The outer diameter of the can roll 7 can be set, for example, to 300 to 2000 mm.

When the can roll 7 rotates, the substrate 21 is sequentially unwound from the feed roller 5 in accordance with the rotation. The unwound substrate 21 comes into contact with the circumferential surface of the can roll 7 so as to be supported thereon and moves in the direction of the rotation, and then the substrate 21 that has come off from the can roll 7 is wound up by the take-up roller 6.

As a forming material for the substrate 21, a material having flexibility that is not damaged by being hung around the can roll 7 is used. Examples of such a material include metal materials, nonmetal inorganic materials, and resin materials.

Examples of such a metal material include stainless steel, alloys such as iron-nickel alloy, copper, nickel, iron, aluminum, and titanium. Further, examples of the above-mentioned iron-nickel alloy include alloy 36 and alloy 42. Among these, the above-mentioned metal material is preferably stainless steel, copper, aluminum, or titanium, from the viewpoint of ease of application to the roll process. Further, the thickness of the substrate formed of the metal material is preferably 5 to 200 μm from the viewpoints of handleability and ease of winding the substrate.

As the above-mentioned nonmetal inorganic materials, glass can be mentioned, for example. Examples of the substrate formed of glass include thin film glass having flexibility. Further, the thickness of the substrate formed of such a nonmetal inorganic material is preferably 5 to 500 μm, from the viewpoints of sufficient mechanical strength and appropriate plasticity.

Examples of the above-mentioned resin materials include synthetic resins such as a thermosetting resin and a thermoplastic resin. Examples of the synthetic resins include a polyimide resin, a polyester resin, an epoxy resin, a polyurethane resin, a polystyrene resin, a polyethylene resin, a polyamide resin, an acrylonitrile-butadiene-styrene (ABS) copolymer resin, a polycarbonate resin, a silicone resin, and a fluororesin. Further, as a substrate formed of such a resin material, films of those synthetic resins mentioned above can be used, for example. Further, the thickness of the substrate is preferably 5 to 500 μm, from the viewpoints of sufficient mechanical strength and appropriate plasticity.

The width of the substrate 21 is appropriately designed corresponding to the dimensions of the organic EL device to be formed, and is preferably 5 mm to 1000 mm, for example, which however is not specifically restricted.

Specifically, a substrate on which an anode layer 23 (see FIG. 2) has been formed in advance by sputtering, for example, can be used as the substrate 21.

As a material for forming the anode layer 23, various transparent conductive materials such as indium-zinc oxide (IZO) and indium-tin oxide (ITO), metals such as gold, silver, and platinum, and alloy materials can be used.

The evaporation source 9 serves to form at least one organic layer (see FIG. 7) including a light emitting layer (organic layer 25a), and at least one evaporation source 9 is provided corresponding to the number of the organic layer to be formed. In this embodiment, one evaporation source 9 is provided for forming one organic layer 25a. The evaporation source 9 is arranged at a position facing the region supporting the substrate 21 on the circumferential surface of the can roll 7, and is configured to form the organic layer 25a (see FIG. 2 and FIG. 7) over the anode layer 23 formed on the substrate 21 by vapor deposition of a material (organic layer-forming material 22) for forming an organic layer over the substrate 21.

Such configuration of the evaporation source 9 is not specifically limited, as long as a nozzle capable of discharging the organic layer-forming material 22 vaporized by heating or the like toward the substrate 21 is provided therein. For example, the evaporation source 9 is configured to accommodate the organic layer-forming material 22, and has a nozzle 9a and a heating unit (not shown). The nozzle 9a is arranged facing the region supporting the substrate 21 on the can roll 7. The above-mentioned heating unit is configured to vaporize the organic layer-forming material 22 by heating, and the vaporized organic layer-forming material 22 is configured to be discharged through an opening 9aa (see FIG. 4 and FIG. 5) of the nozzle 9a to the outside. The opening 9aa is formed into a rectangular shape. The size of the opening 9aa is described later in detail.

Figure 2A:
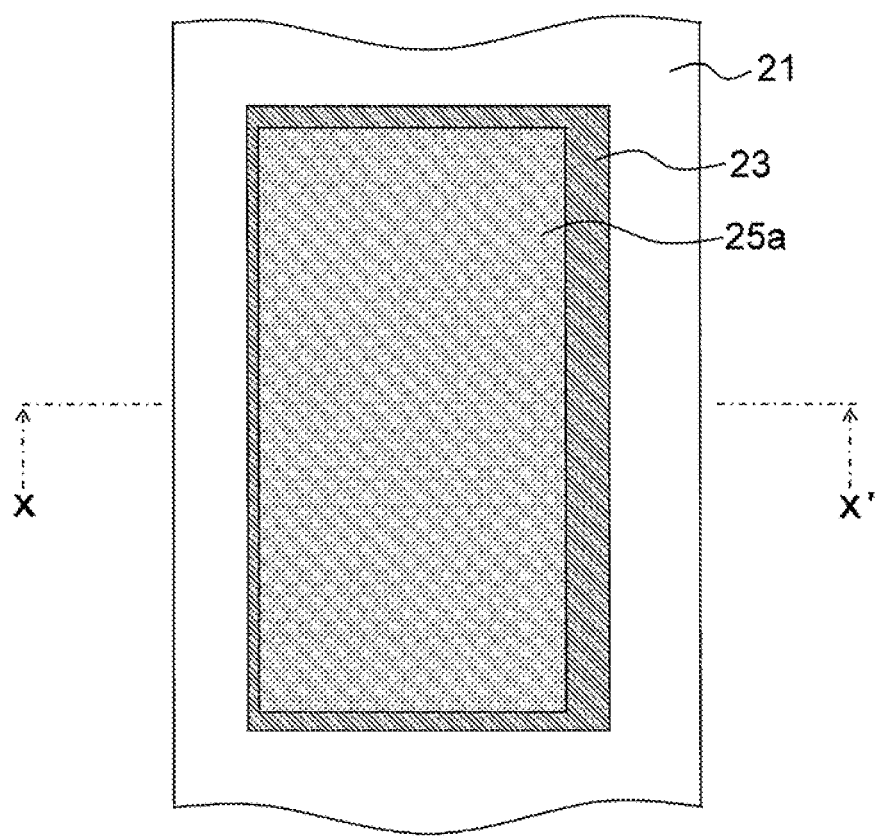
FIG. 2A is a top view showing an example of the positional relationship between an anode layer and an organic layer formed over a substrate, in which the organic layer is stacked over the anode layer.
Figure 2B:
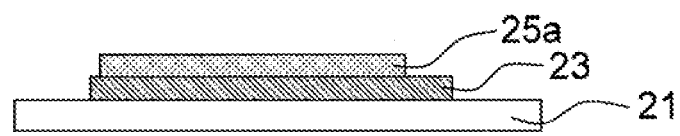
FIG. 2B is a cross-sectional view in the direction of arrows XX' in FIG. 2A.
Figure 7A:
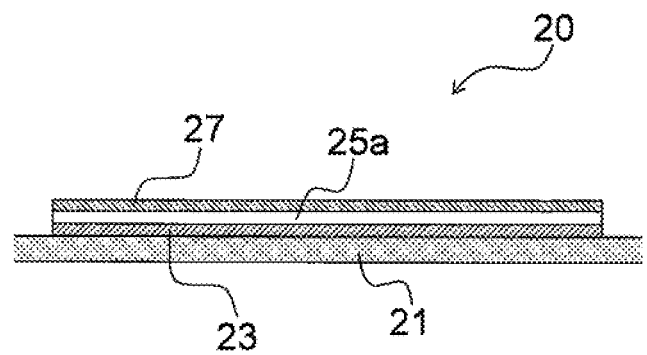
FIG. 7A is a schematic side sectional view schematically showing the layer configuration of an organic EL device provided with one organic layer.

Following heating the organic layer-forming material 22 in the above-mentioned evaporation source 9, the organic layer-forming material 22 is vaporized, and the vaporized organic layer-forming material 22 is discharged toward the substrate 21 through the nozzle 9a, so as to be vapor-deposited over the substrate 21. In this way, the vaporized organic layer-forming material 22 is vapor-deposited over the substrate 21, thereby allowing the organic layer 25a to be formed over the anode layer 23 formed on the substrate 21, as shown in FIG. 2 and FIG. 7A.

Figure 7B:
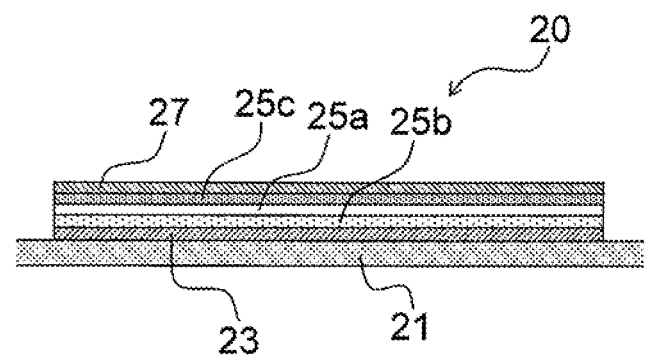
FIG. 7B is a schematic side sectional view schematically showing the layer configuration of an organic EL device provided with three organic layers.

The organic layer is not specifically limited as long as at least a light emitting layer (organic layer 25a) is included therein. Further, a plurality of organic layers may be formed, as needed. For example, as shown in FIG. 7B, three organic layers may be formed by sequentially stacking a hole injection layer (organic layer 25b), the light emitting layer (organic layer 25a) and an electron injection layer (organic layer 25c) in this order. Besides that, four organic layers may be formed by interposing a hole transporting layer (organic layer 25d, see FIG. 7C) between the light emitting layer (organic layer 25a) and the hole injection layer (organic layer 25b) shown above in FIG. 7B, or by interposing an electron transporting layer (organic layer 25e, see FIG. 7C) between the light emitting layer (organic layer 25a) and the electron injection layer (organic layer 25c), as needed.

Figure 7C:
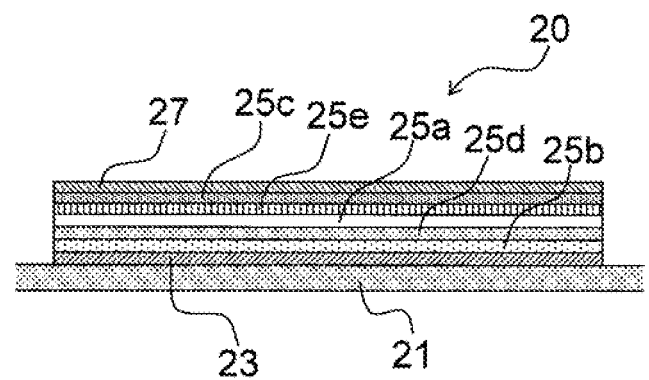
FIG. 7C is a schematic side sectional view schematically showing the layer configuration of an organic EL device provided with five organic layers.

Furthermore, as shown in FIG. 7C, five organic layers may be formed by not only interposing the hole transporting layer (organic layer 25d) between the hole injection layer (organic layer 25b) and the light emitting layer (organic layer 25a), but also interposing the electron transporting layer (organic layer 25e) between the light emitting layer (organic layer 25a) and the electron injection layer (organic layer 25c). The film thickness of each organic layer is generally designed to be several nm to several tens of nm. However, such film thickness is appropriately designed depending on the organic layer-forming material 22, the emission properties, etc., and thus is not specifically limited.

Examples of the material that can be used for forming the above-mentioned light emitting layer include tris(8-hydroxyquinoline) aluminum (Alq3) and iridium complex (Ir (ppy)3)-doped 4,4'N,N'-dicarbazolyl biphenyl (CBP).

Examples of the material that can be used for forming the hole injection layer 25b include copper phthalocyanine (CuPc) and 4,4'-bis[N-4-(N,N-di-m-tolylamino)phenyl]-N-phenylamino]biphenyl (DNTPD).

Examples of the material that can be used for forming the above-mentioned hole transporting layer include 4,4'-bis[N-(1-naphthyl)-N-phenyl-amino]biphenyl (α-NPD) and N,N'-diphenyl-N,N'-bis(3-methylphenyl)-1,1'biphenyl-4,4' diamine (TPD).

Examples of the material that can be used for forming the above-mentioned electron injection layer include lithium fluoride (LiF), cesium fluoride (CsF), and lithium oxide ($Li_2O$).

Examples of the material that can be used for forming the above-mentioned electron transporting layer include tris(8-hydroxyquinoline) aluminum (Alq3), bis(2-methyl-8-quinolinolato)-4-phenylphenolato-aluminum (BAlq), and OXD-7(1,3-bis[5-(p-tert-butylphenyl)-1,3,4-oxadiazole-2-yl]benzene.

Figure 6:
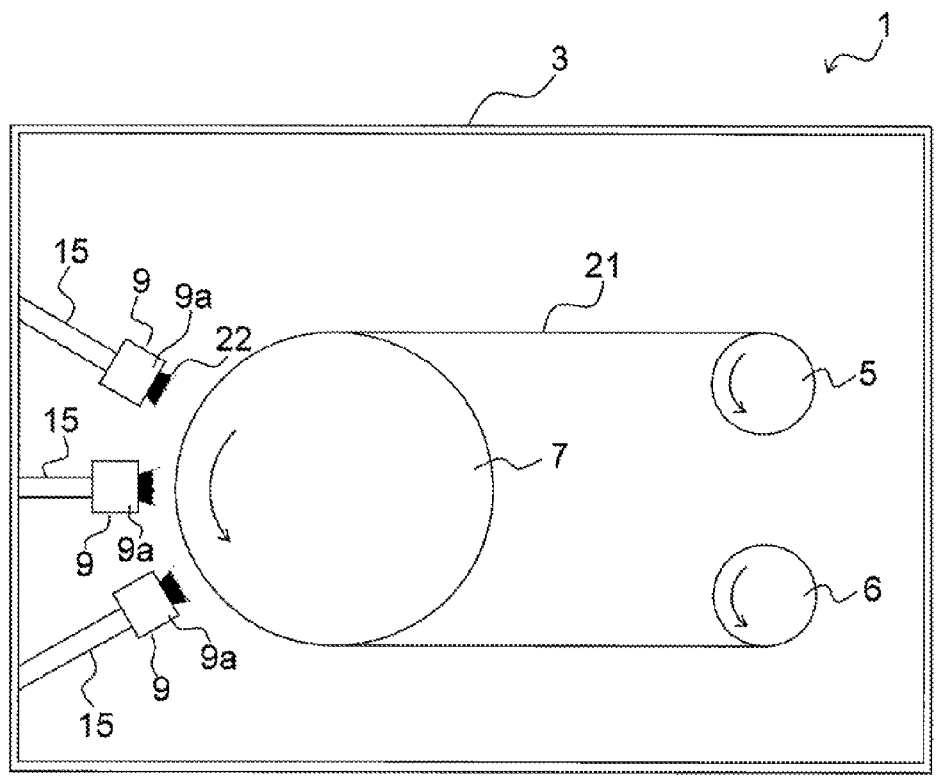
FIG. 6 is a schematic side sectional view schematically showing a plurality of evaporation sources provided within a vacuum chamber.

Further, at least one evaporation source 9 can be provided corresponding to the stacked configuration or the stacked number of organic layers formed over the anode layer 23 of the substrate 21 as mentioned above. For example, in the case where three organic layers are stacked, as shown in FIG. 7B, three evaporation sources can be provided along the direction of the rotation of the can roll 7, as shown in FIG. 6. In this way, in the case where a plurality of evaporation sources 9 are provided along the direction of the rotation of the can roll 7, the first organic layer is vapor-deposited over the anode layer 23 using the evaporation source 9 provided on the most upstream side in the direction of the rotation, and then the second and subsequent organic layers are sequentially vapor-deposited further over the first organic layer using the evaporation sources 9 on the downstream side, so as to be stacked.

Figure 3A:
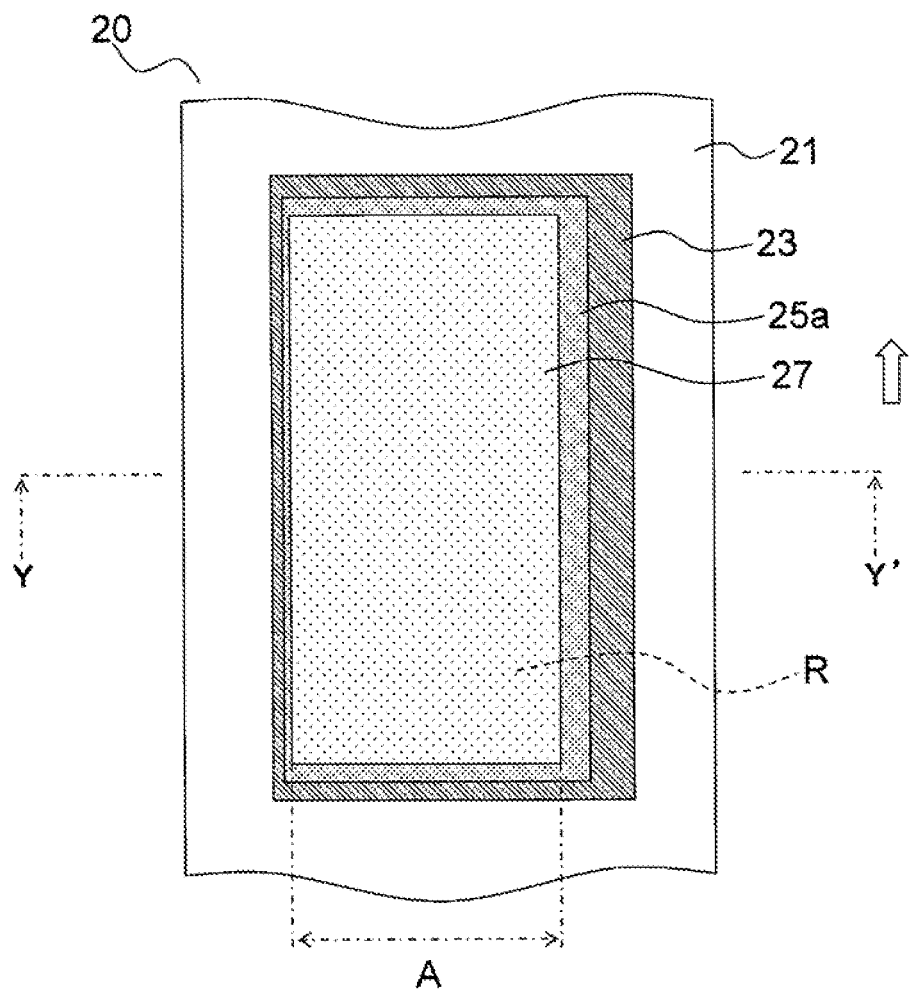
FIG. 3A is a top view showing an example of the positional relationship of an anode layer, an organic layer, and a cathode layer that are formed on a substrate.
Figure 3B:
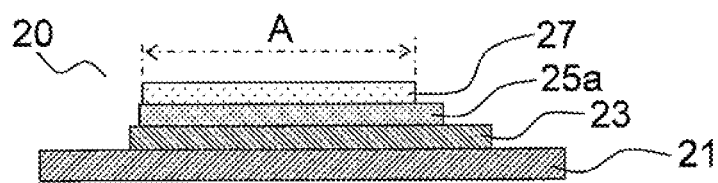
FIG. 3B is a cross-sectional view in the direction of arrows YY' in FIG. 3A.

As a cathode layer 27, aluminum (Al), magnesium (Mg), silver (Ag), ITO, alkali metal, or an alloy containing alkaline earth metal, or the like, can be used. In the example shown in FIG. 3, the cathode layer 27 is formed in a rectangular shape smaller than the organic layer 25a within a portion overlapping the organic layer 25a.

It is also possible to adopt a configuration in which: a vacuum film-forming apparatus for forming the anode layer 23 is provided on the upstream side of the evaporation source 9 for forming the organic layer in the direction of the rotation of the can roll 7, and a vacuum film-forming apparatus for forming the cathode layer 27 is provided on the downstream side thereof. In such a configuration, after the anode layer 23 is deposited on the substrate 21 that is moving while being supported by the can roll 7, the organic layer 25a is vapor-deposited thereover, and the cathode layer 27 is deposited further thereover.

In addition, in the case where materials that can be vapor-deposited using an evaporation source are used as materials for the anode layer 23 and the cathode layer 27, it is also possible to form an organic EL device 20 by providing evaporation sources respectively for the anode layer 23 and the cathode layer 27 in the vacuum chamber 3, and sequentially depositing the anode layer 23, the organic layer 25a, and the cathode layer 27 in this order on the substrate 21.

In the thus formed organic EL device 20, when anode and cathode voltages are applied respectively to the anode layer 23 and the cathode layer 27, a current flows through the organic layer 25a. This causes a region overlapping both the anode layer 23 and the cathode layer 27 in the organic layer 25a to emit light in a direction perpendicular to the substrate (light emitting region).

The width of the above-mentioned light emitting region R of the organic layer 25a in a direction perpendicular to the direction in which the substrate 21 is moving is taken as an emission width A. The light emitted from the light emitting region R is radiated by passing through at least one of the anode layer 23 and the cathode layer 27. The surface of the anode layer 23 or the surface of the cathode layer 27 forms the light emitting surface of the organic EL device 20.

Figure 4:
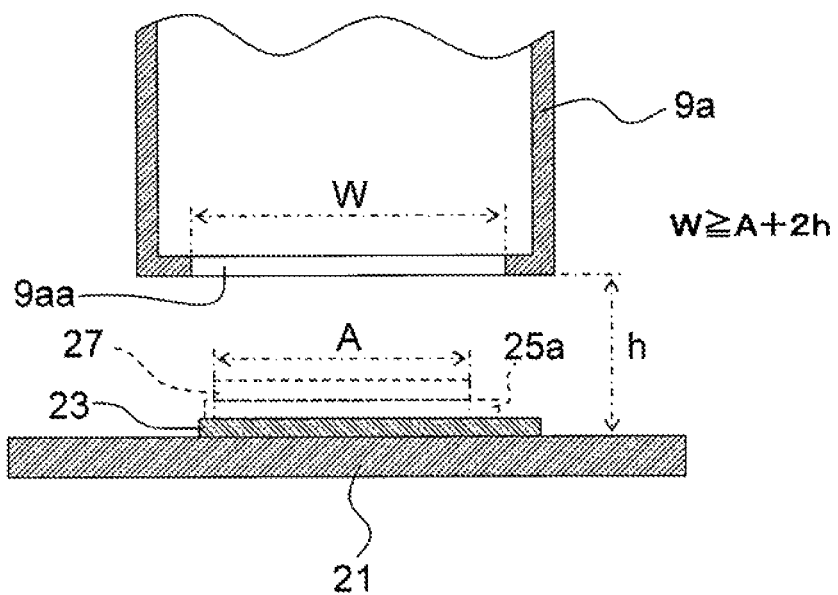
FIG. 4 is an enlarged schematic side sectional view schematically showing the peripheral configuration of a substrate and an opening of a nozzle.
Figure 5:
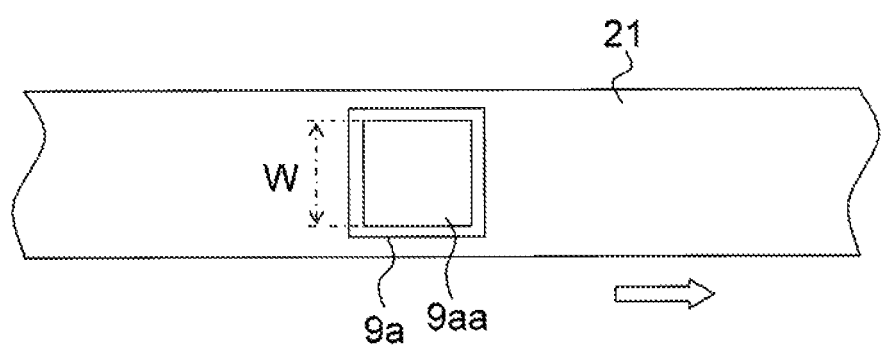
FIG. 5 is an enlarged schematic plan view schematically showing the positional relationship between the substrate and the opening of the nozzle, as viewed from the upper side of FIG. 4.

Next, the relationship of the length (opening width) W (mm) of the opening 9aa of the nozzle 9a in a direction perpendicular to the direction in which the substrate 21 is moving, the emission width A (mm) of the organic layer 25a, and the distance h (mm) between the opening 9aa and the substrate 21 is described. It should be noted that the left-right direction in FIG. 4 is the width direction of the substrate 21, the white arrow in FIG. 5 indicates the direction in which the substrate is moving, and the up-down direction in FIG. 5 is the width direction of the substrate 21 (direction perpendicular to the moving direction). Hereinafter, the "width direction of the substrate" may be referred to simply as the "width direction" in some cases.

As shown in FIGS. 4 and 5, W denotes the opening width of the nozzle 9a, A denotes the emission width of the organic layer 25, and h denotes the distance between the opening 9aa and the substrate 21. In this regard, W, A, and h are designed so as to satisfy W≥A+2×h (where h≤5 mm).

When h is not more than 5 mm (h≤5 mm), the vaporized organic layer-forming material 22 is allowed to reach the substrate 21 with high density, and therefore the use efficiency of the organic layer-forming material 22 can be enhanced. For further increasing the density of the vaporized organic layer-forming material 22, the distance h is preferably not more than 5 mm, more preferably not more than 3 mm. The distance h can be adjusted to a specific value by arranging the nozzle 9a at a position such that the opening 9aa is distant from the substrate 21 by the specific value.

When W≥A+2×h is satisfied, the deposition amount of the organic layer-forming material 22 can be increased at both ends in the width direction of the light emitting region R of the organic layer 25a, and therefore the difference in the deposition amount of the organic layer-forming material 22, that is, the difference in the film thickness between the center and each of both ends in the width direction of the light emitting region R can be reduced. Further, the more the variation in film thickness (thickness) of the organic layer in the organic EL device 20 is suppressed, the more the difference in electrical properties or optical properties is reduced, and thus unevenness in brightness on the light emitting surface can be suppressed. Accordingly, the variation in light emission of the organic layer 25a can be suppressed, which enables efficient production of organic EL devices of high quality in which the variation in emission color is suppressed.

In the direction in which the substrate 21 is moving, the substrate 21 passes through the entire region over which the discharged organic layer-forming material 22 is to be deposited, and therefore the variation in film thickness is small in the light emitting region R. Accordingly, it is made possible to reduce the variation in film thickness of the organic layer caused by variation in discharged amount as mentioned above across the entire light emitting region R by reducing the variation in film thickness of the organic layer in the width direction of the light emitting region R, as mentioned above.

The above-mentioned opening width W is not specifically limited, as long as h is not more than 5 mm, and W≥A+2×h is satisfied. However, excessively small opening width W may possibly make it impossible to form the organic layer sufficiently to form the light emitting region R, whereas excessively large opening width W may possibly causes an increase in size of the manufacturing apparatus, resulting in an increase in cost. For example, when the opening width W is less than 5 mm, the light emitting area is reduced, which may possibly reduce the throughput. Meanwhile, when the opening width W exceeds 1000 mm, the size of the apparatus is increased, which may possibly cause an increase in cost of the apparatus. Accordingly, the opening width W can be appropriately designed, for example, in consideration of such points. The opening width W, for example, is preferably at least 5 mm but not more than 1000 mm, more preferably at least 5 mm but not more than 100 mm, further preferably at least 10 mm but not more than 70 mm. Further, when the opening width W is larger than the width of the substrate 21, the organic layer-forming material 22 may possibly be dispersed unnecessarily. Therefore, taking such points into consideration, the opening width W, for example, preferably does not exceed the width of the substrate 21.

The above-mentioned emission width A is not specifically limited, as long as h is not more than 5 mm, and W≥A+2×h is satisfied. However, excessively small A causes the light emitting region R to be excessively small, which may possibly result in failure to achieve sufficient light emission as an organic EL device, whereas excessively large A may possibly reduce the yield due to incorporation of minute foreign matter. Further, it is also possible to design the emission width A depending on the intended use of the organic EL device. Accordingly, for example, in consideration of such points, the emission width A can be appropriately designed. For example, the emission width A is preferably at least 3 mm but not more than 900 mm, more preferably at least 3 mm but not more than 90 mm, further preferably at least 5 mm but not more than 60 mm.

Next, a method for manufacturing an organic EL device according to one embodiment using the above-mentioned manufacturing apparatus is described.

The method for manufacturing an organic EL device according to this embodiment includes a vapor deposition step for forming the organic layer 25a over the substrate 21 that is moving relative to the nozzle 9a by discharging the vaporized organic layer-forming material 22 through the nozzle 9a. The vapor deposition step is performed so that the light emitting region R formed of the organic layer 25a and having the emission width (width in a direction perpendicular to the substrate moving direction) A is formed, and W≥A+2×h (where h≤5 mm) is satisfied, where W denotes the opening width of the nozzle in a direction perpendicular to the substrate moving direction and h denotes the distance between the opening 9aa and the substrate 21.

In this embodiment, the opening width W, the emission width A, and the distance h are set, the nozzle 9a is arranged corresponding to the thus set distance h, and the dimensions and the positional relationship of the anode layer 23, the organic layer 25a, and the cathode layer 27 are set, in advance, as mentioned above.

For example, it is supposed that the numeral value of the distance h is first set to a specific value of not more than 5 mm, among the opening width W, the emission width A, and the distance h. In the case where the distance h is set first, the emission width A and the opening width W are next set so that W≥A+2×h is satisfied. Then, the dimensions of the light emitting region R are set so as to have the emission width A set above, and the dimensions of the organic layer 25a, the anode layer 23, and the cathode layer 27 and the forming position thereof (that is, overlapping state) are set so that the above-mentioned light emitting region R should be obtained.

Likewise, in the case where the emission width A is set first, the opening width W and the distance h are next set so that the distance h is not more than 5 mm and W≥A+2×h is satisfied. Meanwhile, in the case where the opening width W is set first, the emission width A and the distance h are next set so that the distance h is not more than 5 mm and W≥A+2×h is satisfied.

After such setting, the anode layer 23 is first formed beforehand on one side by sputtering, or the like. Then, the substrate 21 wound up in roll form is unwound from the substrate feeding unit 5.

Subsequently, while the unwound substrate 21 is being moved in contact with the surface of the can roll 7 on the side opposite to the side on which the anode layer 23 has been formed, the organic layer-forming material 22 for forming organic layers including the organic layer 25a (see FIG. 7) is vaporized using the evaporation source 9 arranged facing the can roll 7, and the vaporized organic layer-forming material 22 is discharged through the nozzle 9a so as to be vapor-deposited over the anode layer 23 on the substrate 21 supported by the can roll 7.

Thus, the organic layer 25a can be formed over the substrate 21 so that h is not more than 5 mm and W≥A+2×h is satisfied. After the organic layer 25a is formed, the substrate 21 with the organic layer 25a formed thereover is wound up by the take-up roller 6. Furthermore, the cathode layer 27 is formed over the organic layer 25a using a deposition apparatus (not shown), thereby forming the organic EL device 20 in which the anode layer 23, the organic layer 25a, and the cathode layer 27 are stacked on the substrate 21 in this order.

By manufacturing the organic EL device 20 in this manner, the variation in film thickness in the light emitting region R of the organic layer 25a can be suppressed, as mentioned above.

Since the more the variation in film thickness of the organic layer 25a is suppressed, the more the unevenness in brightness on the light emitting surface of the organic EL device 20 can be suppressed, as mentioned above, the variation in film thickness is preferably within the range of ±10%. By suppressing the variation in film thickness to the range of ±10%, the unevenness in brightness on the light emitting surface of the organic EL device 20 is allowed to be not more than 20%.

The method and apparatus for manufacturing an organic EL device of the present invention are as described above. However, the present invention is not limited to the above-mentioned embodiments, and the design can be modified appropriately without departing from the spirit of the present invention. For example, although the organic layer-forming material 22 is vaporized in the evaporation source 9 in the above-mentioned embodiments, it is also possible to introduce the organic layer-forming material 22 that has been vaporized in a separately provided apparatus into the evaporation source 9 and discharge it through the nozzle 9a of the evaporation source 9.

Further, although the substrate feeding unit 5 is provided inside the vacuum chamber 3 in the above-mentioned embodiments, the feeding method for feeding the substrate 21 to the can roll 7 is not specifically limited, as long as the substrate 21 can be unwound onto the can roll 7. Further, although the substrate 21 after the vapor deposition step is wound up in the above-mentioned embodiments, the substrate 21 may be subjected to another step, such as cutting, without being wound up.

Further, although the light emitting region R is designed by forming the cathode layer 27 into a rectangular shape smaller than the organic layer 25a in the above-mentioned embodiments, the method for designing the light emitting region R is not specifically limited. Besides that, it is also possible to design the light emitting region R by disposing an insulation layer between the organic layer 25a and the cathode layer 27 and forming the insulation layer into a rectangular shape smaller than the organic layer 25a. Further, although the case where the light emitting layer is vapor-deposited as an organic layer is described in the above-mentioned embodiments, the present invention can be applied to a case where a hole injection layer, a hole transporting layer, an electron injection layer, or an electron transporting layer is vapor-deposited as an organic layer by setting the relationship of the opening width W of the evaporation source corresponding to each layer, the emission width A of each organic layer, and the distance h between the substrate 21 and the opening of the nozzle in each evaporation source in the same manner as above.

EXAMPLES

Next, the present invention is described further in detail by way of examples. However, the present invention is not limited to these examples.

<Evaluation of Film Thickness Error in Light Emitting Region of Organic Layer>

In order to accurately measure the variation in film thickness of an organic layer, an organic layer was formed directly on a substrate, and the film thickness of the formed organic layer was measured. The film thickness error was calculated from the measurement results.

Specifically, one evaporation source was provided in a vacuum chamber, as in the above-mentioned embodiments. Tris(8-hydroxyquinoline) aluminum (Alq3) was used as a material for forming an organic layer (light emitting layer), and a flexible glass substrate with a width of 70 mm and a full length of 130 m was used as the substrate 21.

Using the method for manufacturing an organic EL device according to the above-mentioned embodiments, an organic layer was formed by vaporizing Alq3 in the evaporation source and continuously vapor-depositing the vaporized Alq3 directly on the flexible glass substrate. In this regard, the organic layer was formed to a film thickness of 100 nm, while varying the opening width W of the nozzle 9a, the emission width A of the organic layer, and the distance h between the opening and the substrate, respectively in many ways, as shown in Table 1 to 3. Further, the degree of vacuum inside the chamber 3 was set to $5.0 \times 10^{-5}$ Pa, and the heating temperature in the evaporation source was set to 300° C.

As the film thickness of the thus formed light emitting layer, the film thickness of the organic layer was measured every 1 mm in the width direction of the substrate, at the center of the organic layer in the longitudinal direction of the substrate, using a stylus profilometer, Dektak, manufactured by ULVAC, Inc., with the profilometer being in contact with the surface of the formed organic layer. Thus, the film thickness error in the width direction was calculated based on: Film thickness error=(maximum value−minimum value of film thickness)/maximum film thickness×100(%). Evaluation was made as follows.

Film thickness error≤5%: ⊚
5%<Film thickness error≤10%: ○
10%<Film thickness error: ×

Table 1 to Table 3 show the results.

<Evaluation of Unevenness in Brightness in Light Emitting Region of Organic EL Device>

A flexible glass substrate with a width of 70 mm and a length of 130 m on which ITO in a specific pattern is formed as an anode layer was prepared. Using three evaporation sources, CuPc with a film thickness of 25 nm as a hole injection layer, NPB with a film thickness of 45 nm as a hole transporting layer, Alq3 with a film thickness of 60 nm as a light emitting layer, LiF with a film thickness of 0.5 nm as an electron injection layer, and Al with a film thickness of 10 nm as a cathode layer were sequentially formed as organic layers over the anode layer on the substrate in this order. Further, the opening width W, the emission width A, and the distance h were varied every series of formation of CuPc, NPB, and Alq3, as shown in Tables 1, 2, and 3.

The thus formed organic EL device was allowed to emit light by applying a voltage to the anode layer 23 and the cathode layer 27 so that the density of the current flowing through the organic layer 25 should be 7.5 mA/cm². At this time, using the organic EL characterization system (organic EL light emission efficiency measuring apparatus, type EL-1003, manufactured by PRECISE GAUGES Co., Ltd.), the brightness on the light emitting surface in the light emitting region of the organic EL device was measured every 1 mm in the width direction of the substrate, at the center of the organic EL device in the longitudinal direction of the substrate. The unevenness in brightness in the width direction was calculated from the measurement results based on:
Unevenness in brightness=
(Maximum brightness−Minimum brightness)/Maximum brightness×100(%).

Evaluation was made as follows.
Unevenness in brightness≤10%: ⊚
10%<Unevenness in brightness≤20%: ○
20%<Unevenness in brightness: ×

Table 1 to Table 3 show the results.

TABLE 1

| | W | A | h | A + 2 × h | W ≥ A + 2 × h | Film Thickness Error (%) | Evaluation | Unevenness in Brightness (%) | Evaluation |
|---|---|---|---|---|---|---|---|---|---|
| EX. 1 | 20 | 18 | 0.5 | 19 | ○ | 2 | ⊚ | 4 | ⊚ |
| EX. 2 | 20 | 18 | 1 | 20 | ○ | 7 | ○ | 14 | ○ |
| C. EX. 1 | 20 | 18 | 2 | 22 | X | 18 | X | 36 | X |
| C. EX. 2 | 20 | 18 | 3 | 24 | X | 25 | X | 50 | X |
| C. EX. 3 | 20 | 18 | 4 | 26 | X | 29 | X | 58 | X |
| C. EX. 4 | 20 | 18 | 5 | 28 | X | 30 | X | 60 | X |
| EX. 3 | 20 | 16 | 0.5 | 17 | ○ | 1 | ⊚ | 2 | ⊚ |
| EX. 4 | 20 | 16 | 1 | 18 | ○ | 3 | ⊚ | 6 | ⊚ |
| EX. 5 | 20 | 16 | 2 | 20 | ○ | 9 | ○ | 18 | ○ |
| C. EX. 5 | 20 | 16 | 3 | 22 | X | 15 | X | 30 | X |
| C. EX. 6 | 20 | 16 | 4 | 24 | X | 19 | X | 38 | X |
| C. EX. 7 | 20 | 16 | 5 | 26 | X | 21 | X | 42 | X |
| EX. 6 | 20 | 10 | 0.5 | 11 | ○ | 0 | ⊚ | 0 | ⊚ |
| EX. 7 | 20 | 10 | 1 | 12 | ○ | 0 | ⊚ | 0 | ⊚ |
| EX. 8 | 20 | 10 | 2 | 14 | ○ | 2 | ⊚ | 4 | ⊚ |
| EX. 9 | 20 | 10 | 3 | 16 | ○ | 3 | ⊚ | 6 | ⊚ |
| EX. 10 | 20 | 10 | 4 | 18 | ○ | 5 | ⊚ | 10 | ⊚ |
| EX. 11 | 20 | 10 | 5 | 20 | ○ | 6 | ○ | 12 | ○ |

Table 1 shows the results in the case of keeping the opening width W constant at W=20 mm and varying the emission width A and the distance h. As shown in Examples 1 to 5, it was recognized that in both cases of A=18 mm and 16 mm, the film thickness error and unevenness in brightness of those satisfying W≥A+2×h were small (indicated as ○ in the tables). In contrast, as shown in Comparative Examples 1 to 7, it was recognized that both the film thickness error and unevenness in brightness of those not satisfying W≥A+2×h were large (indicated as x in the tables). Further, as shown in Examples 6 to 11, it was recognized that, since W≥A+2×h was satisfied regardless of the values of the emission width A and the distance h when the difference between the opening width W and the emission width A (W−A) was 10 mm or more, the film thickness error and unevenness in brightness were small.

12 to 16, it was recognized that in all cases of A=9 mm, 8 mm, and 7 mm, the film thickness error and unevenness in brightness of those satisfying W≥A+2×h were small (indicated as ○ in the tables). In contrast, as shown in Comparative Examples 8 to 20, it was recognized that both the film thickness error and unevenness in brightness of those not satisfying W≥A+2×h were large (indicated as x in the tables). Since the difference between the opening width W and the emission width A (W−A) is less than 10 mm in the case of W=10 mm, there were no cases where W≥A+2×h

TABLE 2

| | W | A | h | A + 2 × h | W ≥ A + 2 × h | Film Thickness Error (%) | Evaluation | Unevenness in Brightness (%) | Evaluation |
|---|---|---|---|---|---|---|---|---|---|
| EX. 12 | 10 | 9 | 0.5 | 10 | ○ | 5 | ⊚ | 10 | ⊚ |
| C. EX. 8 | 10 | 9 | 1 | 11 | X | 16 | X | 31 | X |
| C. EX. 9 | 10 | 9 | 2 | 13 | X | 25 | X | 51 | X |
| C. EX. 10 | 10 | 9 | 3 | 15 | X | 29 | X | 57 | X |
| C. EX. 11 | 10 | 9 | 4 | 17 | X | 29 | X | 58 | X |
| C. EX. 12 | 10 | 9 | 5 | 19 | X | 28 | X | 56 | X |
| EX. 13 | 10 | 8 | 0.5 | 9 | ○ | 2 | ⊚ | 4 | ⊚ |
| EX. 14 | 10 | 8 | 1 | 10 | ○ | 7 | ○ | 14 | ○ |
| C. EX. 13 | 10 | 8 | 2 | 12 | X | 16 | X | 32 | X |
| C. EX. 14 | 10 | 8 | 3 | 14 | X | 21 | X | 42 | X |
| C. EX. 15 | 10 | 8 | 4 | 16 | X | 22 | X | 44 | X |
| C. EX. 16 | 10 | 8 | 5 | 18 | X | 22 | X | 44 | X |
| EX. 15 | 10 | 7 | 0.5 | 8 | ○ | 1 | ⊚ | 2 | ⊚ |
| EX. 16 | 10 | 7 | 1 | 9 | ○ | 5 | ⊚ | 9 | ⊚ |
| C. EX. 17 | 10 | 7 | 2 | 11 | X | 11 | X | 23 | X |
| C. EX. 18 | 10 | 7 | 3 | 13 | X | 16 | X | 31 | X |
| C. EX. 19 | 10 | 7 | 4 | 15 | X | 17 | X | 35 | X |
| C. EX. 20 | 10 | 7 | 5 | 17 | X | 18 | X | 35 | X |

Table 2 shows the results in the case of keeping the opening width W constant at W=10 mm and varying the emission width A and the distance h. As shown in Examples was satisfied regardless of the values of the emission width A and the distance h, unlike the cases of Table 1 mentioned above.

TABLE 3

| | W | A | h | A + 2 × h | W ≥ A + 2 × h | Film Thickness Error (%) | Evaluation | Unevenness in Brightness (%) | Evaluation |
|---|---|---|---|---|---|---|---|---|---|
| EX. 17 | 50 | 48 | 0.5 | 49 | ○ | 2 | ⊚ | 4 | ⊚ |
| EX. 18 | 50 | 48 | 1 | 50 | ○ | 7 | ○ | 14 | ○ |
| C. EX. 21 | 50 | 48 | 2 | 52 | X | 18 | X | 36 | X |
| C. EX. 22 | 50 | 48 | 3 | 54 | X | 25 | X | 50 | X |
| C. EX. 23 | 50 | 48 | 4 | 56 | X | 29 | X | 58 | X |
| C. EX. 24 | 50 | 48 | 5 | 58 | X | 30 | X | 60 | X |
| EX. 19 | 50 | 46 | 0.5 | 47 | ○ | 1 | ⊚ | 2 | ⊚ |
| EX. 20 | 50 | 46 | 1 | 48 | ○ | 3 | ⊚ | 6 | ⊚ |
| EX. 21 | 50 | 46 | 2 | 50 | ○ | 9 | ○ | 18 | ○ |
| C. EX. 25 | 50 | 46 | 3 | 52 | X | 15 | X | 30 | X |
| C. EX. 26 | 50 | 46 | 4 | 54 | X | 19 | X | 38 | X |
| C. EX. 27 | 50 | 46 | 5 | 56 | X | 21 | X | 42 | X |
| EX. 22 | 50 | 40 | 0.5 | 41 | ○ | 0 | ⊚ | 0 | ⊚ |
| EX. 23 | 50 | 40 | 1 | 42 | ○ | 0 | ⊚ | 0 | ⊚ |
| EX. 24 | 50 | 40 | 2 | 44 | ○ | 2 | ⊚ | 4 | ⊚ |
| EX. 25 | 50 | 40 | 3 | 46 | ○ | 3 | ⊚ | 6 | ⊚ |
| EX. 26 | 50 | 40 | 4 | 48 | ○ | 5 | ⊚ | 10 | ⊚ |
| EX. 27 | 50 | 40 | 5 | 50 | ○ | 6 | ○ | 12 | ○ |

Table 3 shows the results in the case of keeping the opening width W constant at W=50 mm and varying the emission width A and the distance h. As shown in Examples 17 to 21, it was recognized that in both cases of A=48 mm and 46 mm, the film thickness error and unevenness in brightness of those satisfying W≥A+2×h were small (indicated as ○ in the tables). In contrast, as shown in Comparative Examples 21 to 27, it was recognized that both the film thickness error and unevenness in brightness of those not satisfying W≥A+2×h were large (indicated as x in the tables). Further, as shown in Examples 22 to 27, it was recognized that, since W≥A+2×h was satisfied regardless of the values of the emission width A and the distance h, in the same manner as in Table 1 above, when the difference between the opening width W and the emission width A (W−A) is 10 mm or more, the film thickness error and unevenness in brightness were small.

It has been found from the above-mentioned results that the method for manufacturing an organic EL device and the apparatus for manufacturing an organic EL device according to the present invention can suppress the variation in film thickness of the organic layer formed over the substrate 21 and can suppress the variation in emission color of the organic EL device.

REFERENCE SIGNS LIST

1: Apparatus for manufacturing an organic EL device
3: Vacuum chamber
3*a*: Inner wall
5: Substrate feeding unit
7: Can roll
9: Evaporation source
9*a*: Nozzle
9*aa*: Opening
20: Organic EL device
21: Substrate
25*a*: Organic layer
W: Opening width
A: Emission width
h: Distance

The invention claimed is:

1. A method for manufacturing an organic EL device, comprising:
providing a substrate having a strip shape from a substrate feeding unit in which the substrate is wound up in roll shape;
forming an organic layer over the substrate moving relative to a nozzle by discharging a vaporized organic layer-forming material through the nozzle;
forming a light emitting region comprising the organic layer,
wherein the light emitting region has a width A (mm) in a direction perpendicular to a direction in which the substrate is moving, and W≥A+2×h where h≤5 mm is satisfied, where a length of an opening of the nozzle in the direction perpendicular to the direction in which the substrate is moving is denoted by W (mm), and a distance between the opening and the substrate is denoted by h (mm), wherein the opening of the nozzle W does not exceed the width of the substrate; and
winding up the substrate by a substrate restoring unit.

2. The method for manufacturing an organic EL device according to claim 1, wherein the vaporized organic layer-forming material is discharged through the opening.

3. The method for manufacturing an organic EL device according to claim 1, wherein the length W (mm) is in the range of 5 to 100 mm.

4. The method for manufacturing an organic EL device according to claim 1, wherein the width A (mm) is in the range of 3 to 90 mm.

5. The method for manufacturing an organic EL device according to claim 1, wherein the substrate is a flexible substrate.

6. The method for manufacturing an organic EL device according to claim 1, wherein the substrate comprises a metal material and has a thickness in the range of 5 to 200 μm.

7. The method for manufacturing an organic EL device according to claim 1, wherein the substrate comprises a nonmetal inorganic material and has a thickness in the range of 5 to 500 μm.

8. The method for manufacturing an organic EL device according to claim 1, wherein the substrate comprises a resin material and has a thickness in the range of 5 to 500 μm.

9. The method for manufacturing an organic EL device according to claim 1, wherein the substrate has a width in the range of 5 to 1000 mm.

10. An apparatus for manufacturing an organic EL device, comprising:
a substrate feeding unit for unwinding a substrate having a strip shape and wound up in roll shape;
an evaporation source for forming an organic layer over the substrate moving relative to a nozzle by discharging a vaporized organic layer-forming material through the nozzle,
wherein the apparatus is configured so that a light emitting region of the organic EL device is formed of the organic layer and has a width A (mm) in a direction perpendicular to a direction in which the substrate is moving, and so that W≥A+2×h where h≤5 mm is satisfied, where a length of an opening of the nozzle in the direction perpendicular to the direction in which the substrate is moving is denoted by W (mm), and a distance between the opening and the substrate is denoted by h (mm), wherein the opening of the nozzle W does not exceed the width of the substrate; and
a substrate restoring unit for winding up the substrate.

11. The apparatus for manufacturing an organic EL device according to claim 10, wherein the vaporized organic layer-forming material is discharged through the opening.

12. The apparatus for manufacturing an organic EL device according to claim 10, wherein the length W (mm) is in the range of 5 to 100 mm.

13. The apparatus for manufacturing an organic EL device according to claim 10, wherein the width A (mm) is in the range of 3 to 90 mm.

14. The apparatus for manufacturing an organic EL device according to claim 10, wherein the substrate is a flexible substrate.

15. The apparatus for manufacturing an organic EL device according to claim 10, wherein the substrate comprises a metal material and has a thickness in the range of 5 to 200 μm.

16. The apparatus for manufacturing an organic EL device according to claim 10, wherein the substrate comprises a nonmetal inorganic material and has a thickness in the range of 5 to 500 μm.

17. The apparatus for manufacturing an organic EL device according to claim 10, wherein the substrate comprises a resin material and has a thickness in the range of 5 to 500 μm.

18. The apparatus for manufacturing an organic EL device according to claim 10, wherein the substrate has a width in the range of 5 to 1000 mm.

\* \* \* \* \*